United States Patent [19]

Okubo et al.

[11] Patent Number: 5,055,778
[45] Date of Patent: Oct. 8, 1991

[54] PROBE CARD IN WHICH CONTACT PRESSURE AND RELATIVE POSITION OF EACH PROBE END ARE CORRECTLY MAINTAINED

[75] Inventors: Kazumasa Okubo, Kanagawa; Masao Okubo, Nishinomiya; Yasuro Yoshimitsu, Takatsuki; Kiyoshi Sugaya, Amagasaki, all of Japan

[73] Assignee: Nihon Denshizairyo Kabushiki Kaisha, Amagasaki, Japan

[21] Appl. No.: 548,401

[22] Filed: Jul. 5, 1990

[30] Foreign Application Priority Data

Oct. 2, 1989 [JP] Japan ............................... 1-258113
Dec. 6, 1989 [JP] Japan .......................... 1-141180[U]
Dec. 27, 1989 [JP] Japan ......................... 1-152350[U]

[51] Int. Cl.⁵ ................................................ G01R 31/02
[52] U.S. Cl. .............................. 324/158 P; 324/158 F
[58] Field of Search ............. 324/158 P, 158 F, 72.5, 324/500, 537; 439/482

[56] References Cited

U.S. PATENT DOCUMENTS

| | | | |
|---|---|---|---|
| 3,445,770 | 5/1969 | Harmon ........................... | 324/158 P |
| 3,835,381 | 9/1974 | Garretson et al. ............... | 324/158 P |
| 3,866,119 | 2/1975 | Ardezzone et al. .............. | 324/158 P |
| 4,649,339 | 3/1987 | Grangroth et al. ............... | 324/158 F |
| 4,758,785 | 7/1988 | Rath ................................. | 324/158 F |
| 4,820,976 | 4/1989 | Brown ............................. | 324/158 F |
| 4,912,399 | 3/1990 | Greub et al. ..................... | 324/158 F |

FOREIGN PATENT DOCUMENTS

0262850 10/1988 Japan ............................... 324/158 P
0296167 11/1989 Japan ............................... 324/158 P

*Primary Examiner*—Kenneth A. Wieder
*Assistant Examiner*—Vinh P. Nguyen
*Attorney, Agent, or Firm*—Armstrong, Nikaido, Marmelstein, Kubovcik & Murray

[57] ABSTRACT

Probe card is a part which is incorporated into probing equipment to test finished IC chips. This card is customarily mounted with a plurality of probes, very fine needle and generally L letter shaped, each of which is disposed so that its front end may project downwardly toward an IC chip. Conventional probes are difficult to align all the probe front ends with electrical ends on the IC chip. Overdrive is normally taken to produce adequate contact pressures with respective probes after all contacts between the probe front ends and the IC ends are formed, but this action often causes conventional probe ends to slip down from the IC ends. The proposed probe card includes a new provision of a resin layer of an elastic, insulative characteristic to fill the central open area of the supporter which is assembled into the probe card. The filling, by such a resin layer, makes the probe front ends resiliently held in position so that a deviation from proper respective dispositions by overdrive becomes avoidable. The disclosure refers to additional devices to enhance the convenience in determining the alignment between the probe front ends and the IC ends, and also in obtaining accurate measurements of an IC chip under test.

1 Claim, 10 Drawing Sheets

PROBE CARD IN WHICH CONTACT PRESSURE AND RELATIVE POSITION OF EACH PROBE END ARE CORRECTLY MAINTAINED

FIELD OF THE INVENTION

This invention relates to a probe card, which is applied to test or to check electrical characteristics of an IC chip in a state of being incorporated into probing equipment.

DESCRIPTION OF THE CONVENTIONAL ART

Conventionally, a probe card comprises a substrate board provided with printed circuits made of copper film on one surface and an opening at a central portion, an insulative supporter of a generally ring shape having a size of engaging inside the opening of the board, and a plurality of probes which are mounted on an inward slope formed on an upside of the insulative supporter, wherein mountings of the probes are often provided with aid of an epoxy based adhesive.

A probe is designed to have a generally L letter shape so that a front tip thereof may be inserted into the central opening of the board to project the front tip downwardly or toward an underside of the substrate board while a rear tip of the probe is connected to an end of the printed circuits on the board.

A probe card thus structured is customarily incorporated into probing equipment in place and is operated using the front tip thereof to test an IC chip, placed for testing measurements, under an adequate contact pressure which occurs on contact with an electrical lead formed on the IC chip.

However, the conventional probe cards as described above have such problems or disadvantages as will be apparent in the following: Where an IC chip is provided with a plurality of bumps at respective electrical ends, there is some irregularity with a bump height and/or a downward length of a probe tip. Because of these irregularities, some probe tips tend to slip down from the target bumps during operation. That is, all probes and bumps are not always aligned so as to contact each other with an even contact pressure. This situation causes some probes in contact to slip down when an "overdrive" act, known in the pertinent art, takes place. Further, at this time, the tip end of the probe is sometimes damaged or deformed. The uneven contacts as noted before and possible damage at the probe tip have yielded larger difference in contact pressures, thus accurate measurements have become difficult to carry out. Therein, correction or alignment by eyesight is useless, because of the extremely thin or fine design of a probe tip.

The recent trend of becoming denser and finer integration with IC chips has made the accurate alignment of a probe for an IC chip, more difficult wherein an IC chip having ends arranged with a 90 micro meter interspace, for instance, requires a probe having a small diameter such as 30 micro meters. Such a fine probe however is almost incapable normally of producing a measurable contact pressure. Referring specifically to a probe having a 30 micro meter diameter, acting thereon an overdrive for 1 mil length produces only about 5 g/mm contact pressure, but a contact resistance shares significantly in such a small value. Thus, accurate measurements are made very difficult to be carried out.

SUMMARY OF THE INVENTION

This invention intends to resolve the difficulties involved in the conventional art and enables prevention of a probe from slipping down from a bump formed at an electrical end, and also to obtain a significant contact pressure, whereby the alignment is eased and arrangement of probes on a probe card is improved to cope with a highly densed IC chip.

Note: in the following, the term "substrate board" is often abbreviated to "board", "electrical end" is also abbreviated to "end", and "insulative supporter" is abbreviated to "supporter". As for later appearing terms, similar abbreviations will be applied for simplicity.

A first aspect of this invention relates to a probe card for measuring electrical characteristics of an IC chip by contacting a probe to an end on a chip, wherein the probe card comprises a board provided with printed circuits and an opening at a central portion. A supporter of a generally ring shape has a size which engages inside the opening of the board. A plurality of probes having rear ends connected with the circuits and having front ends inserted downwardly into the internal open area of the ring supporter. (Note: the description so far defines a conventional probe card) featuring. The new provision is a plate made of an elastic, insulative resin layer for filling the internal area of the ring supporter so that front ends of the probes may hold respective positions more accurately.

An overdrive act receives a resistive deformation by the resin layer to restrict lateral movement of the probe front tips. That is, the provision of the resin layer effects to fastening or immobilizing the probe tips which run therethrough.

A second aspect of this invention relates to a probe card for measuring electrical characteristics of an IC chip by contacting a probe to an end on a chip. The probe card comprises a board provided with printed circuits and an opening at a central portion. A supporter of a generally ring shape has a size which engages inside the opening of the board. A plurality of probes have rear ends connected with the circuits and have front ends inserted downwardly into the internal open area of the ring supporter. (note: the description so far defines a conventional probe card) The new provision are a) a plate made of an elastic, insulative resin layer for filling the internal area of the ring supporter so that front ends of the probes may hold respective positions more accurately, and b) a pressure plate which is laid over the filling resin layer.

The overlaid plate controls deformation of the filling resin layer to maintain a desired pressure.

A third aspect of this invention relates to a probe card for measuring electrical characteristics of an IC chip by contacting a probe to an end on a chip. The probe card comprises a board provided with printed circuits and an opening at a central portion. A supporter of a generally ring shape has a size which engages inside the opening of the board. A plurality of probes have rear ends connected with the circuits and have front ends inserted downwardly into the internal open area of the ring supporter. (note: the description so far defines a conventional probe card) The new provision is a plate made of an elastic, insulative resin layer for filling the internal area of the ring supporter so that front ends of the probes may hold respective positions more accurately, and wherein the filling resin layer is light transparent, and light opaque markings for indicating locations of electrical ends are marked on an upper side a lower side of the filling resin layer.

The alignment between the probe front ends and the electrical ends of the IC chip may be determined by knowing if all the electrical ends vanish visually under the markings.

A fourth aspect of this invention relates to a probe card for measuring electrical characteristics of an IC chip by contacting a probe to an end on a chip. The probe card comprises a board provided with printed circuits and an opening at a central portion. A supporter of a generally ring shape has a size which engages inside the opening of the board. A flexible film is provided to cover the undermouth or underperiphery of the internal open area of the ring supporter and is provided with electrical leads and through holes correspondent to the ends on the chip. A plurality of probes are each molded unitary with a hold portion to be disposed on the flexible film and a front portion to be inserted downwardly into the through hole. An elastic insulative resin layer or plate is to fill a cavity formed by the flexible film and the ring wall of the supporter. Lead lines connect the probe ends with the printed circuits on the board.

An overdrive act causes deformation of the resin layer, through the structure integrative of the flexible film with probes, a desired pressure is rendered to all of the probe front tips.

BRIEF DESCRIPTION OF THE DRAWINGS

FIG. 2 includes two sub-drawings of FIG. 2 (a) and FIG. 2 (b), each of which shows an enlarged view of a front portion of the probe incorporated in the embodiment shown by FIG. 1.

FIG. 6 includes three sub-drawings of FIG. 6 (a), FIG. 6 (b), and FIG. 6 (c), each of which shows key portions of a probe card belonging to a third embodiment.

FIG. 8 shows an enlarged view of a portion as marked in FIG. 7.

These drawings are presented to illustrate the invention. Therefore the drawings should not be construed as limiting the invention.

DESCRIPTION OF THE EMBODIMENTS OF THE PRESENT INVENTION

In the following, the description will proceed with reference to the drawings, wherein a like numeral indicates a like part.

In the FIGS. 1–4, the numeral 10 designates a substrate board, on which printed circuits 12 are mounted, and an opening 11 having a stepped ring wall is formed at a central portion of the board 10. An insulative supporter 20 has a size which engages internally with the central opening 11 of the board 10. The supporter 20 is customarily made from a ceramic or a metal overlaid with an insulative film and is provided at a central portion with an opening 21 having an inward slope extending from the upper side 22. The under side 23 of the supporter 20 is formed to have a small lower side projection from the downside of the board 10.

Figure 2A:
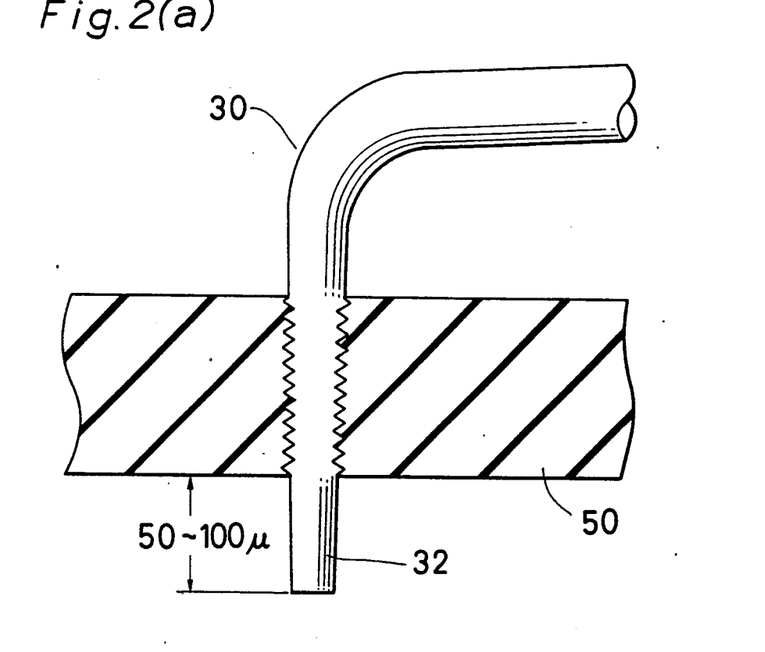
Figure 2B:
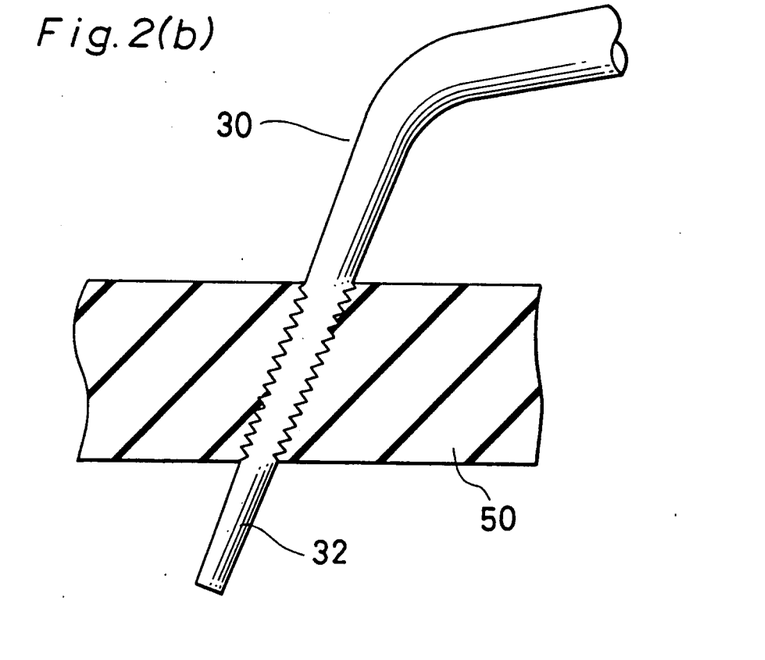

A probe 30 has a generally L shape at its front portion. The probe 30 is set on the inward slope of the upper side 22 with a middle portion adhered by an epoxy adhesive 40 to take a radial disposition, and the front L portion is extended downward into the central opening 21 to open the front tip 32 downwardly out of the under side of the supporter 20. The rear end 33 of the probe 30 is connected by solder 331 to an end of the printed circuits 12. As shown in FIGS. 2 (a) and 2 (b), a front portion adjacent to the front end 32 of the probe 30 is provided with some fine unevenness to enhance attachment with the insulative resin 50 which will appear in the following.

An insulative resin 50, for instance, is a silicone rubber, which plugs or fills the opening 21. As shown in FIG. 2, the front end 32 of the probe 30 is set by the resin 50 so that a length of 50 to 100 micro meters is extended downward, wherein the uneven portion acts to produce more attachment or integration with the resin 50. Therefore, one probe is set at its front portion with the aid of the resin 50, at its middle portion with the aid of the adhesive 40, and at its rear portion with the aid of solder 331. As shown in the two drawings of FIG. 2, the front end 32 may be held vertical as in (a) or oblique as in (b). Referring to the resin 50, if an epoxy resin is used, the opening 20 is priorly filled with a transparent film and thereon the epoxy resin is applied so as to fix the probe tip 32. However, in the case of silicone rubber, prior setting of a transparent film is avoided. Transparency is not a requisite with the resin 50, but this property helps visual alignment. Turning to operation of the probe card as noted above, wherein it is assumed that a bump 611 has been formed on an electrical end 61 of an IC chip 60 to be tested.

Figure 1:
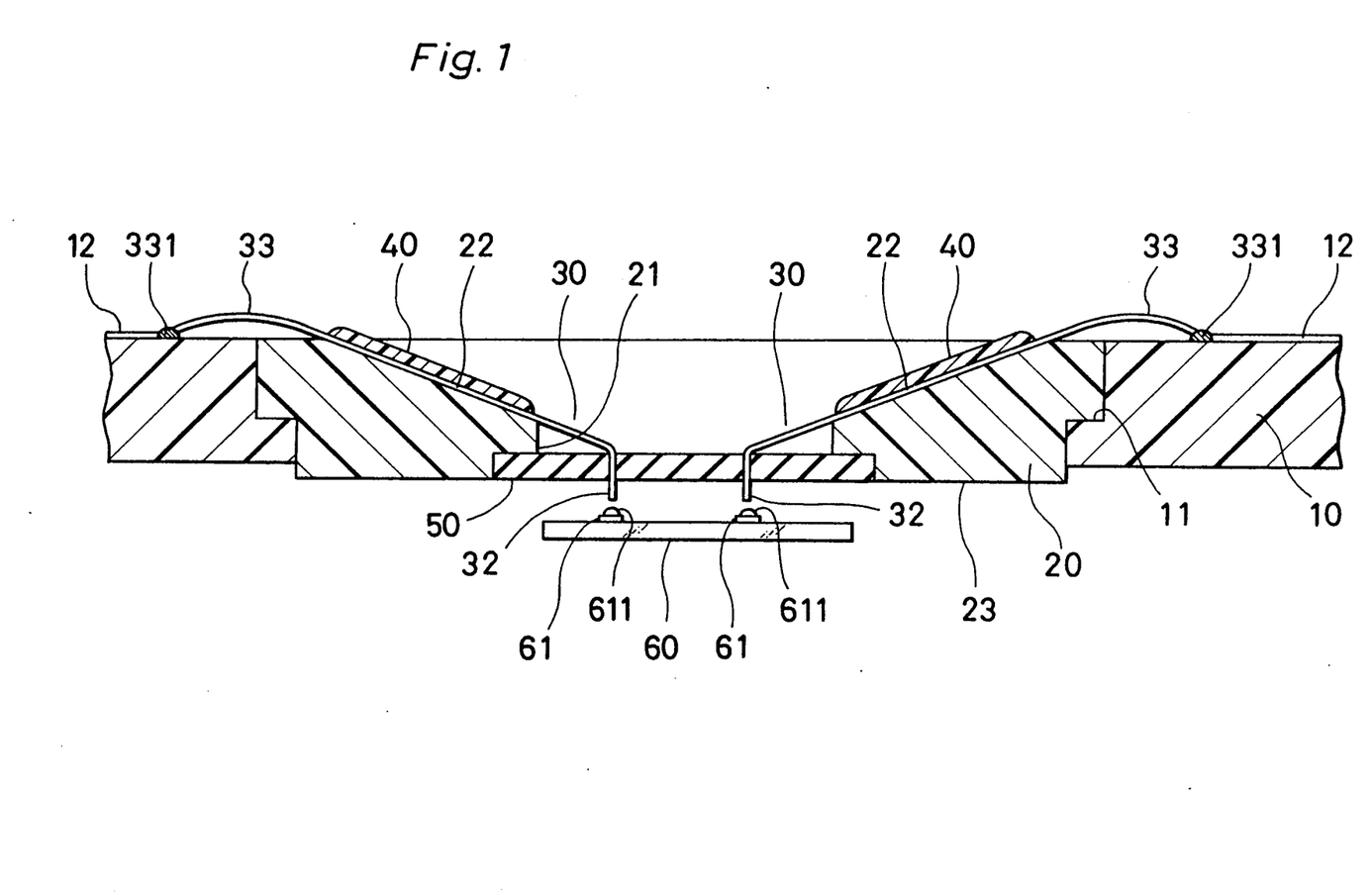
FIG. 1 shows a schematic sectional view of a first embodiment.
Figure 3:
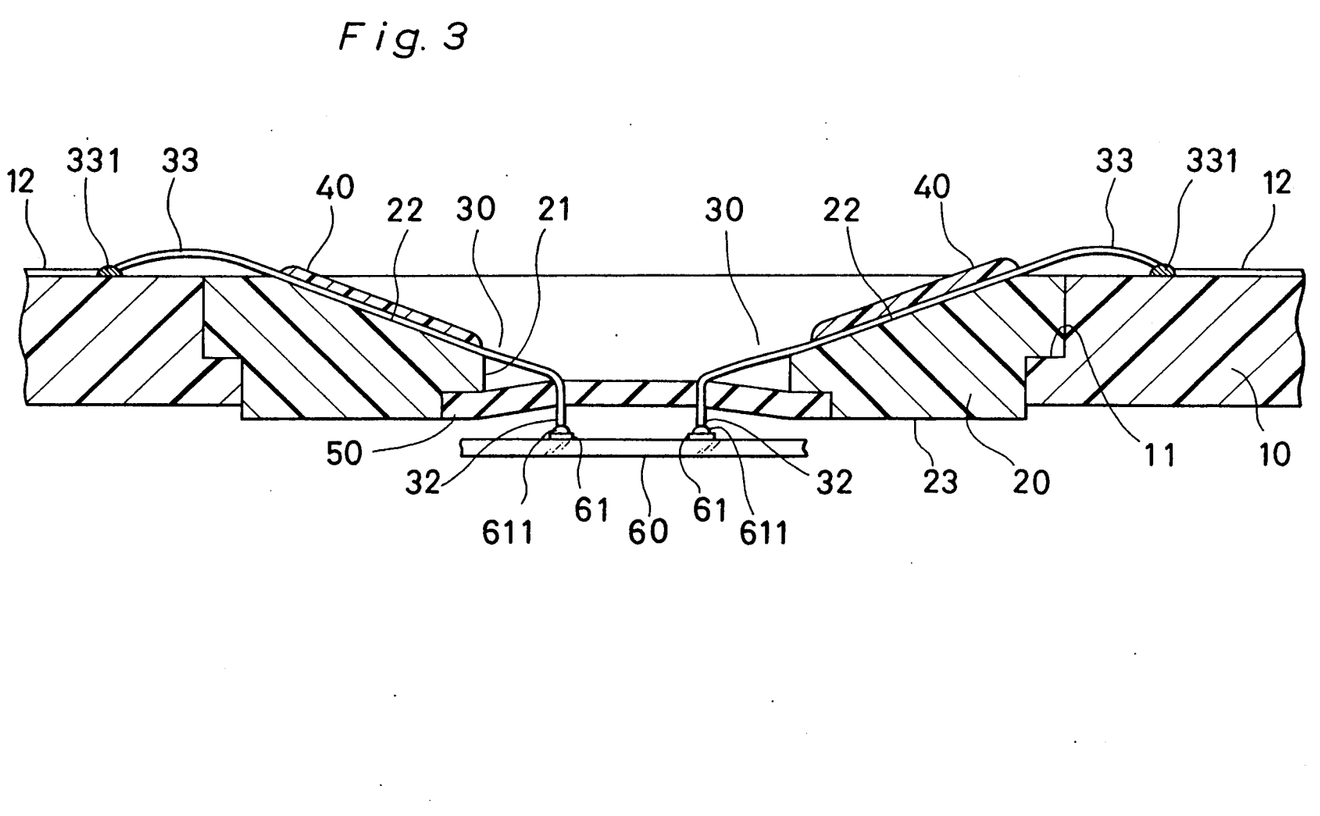
FIG. 3 shows a view similar to FIG. 1 and is helpful to explain how the probe operates.

Starting at the arrangement shown in FIG. 1, for instance, the board 10 is moved toward (in the drawings, it means downward) the IC chip 60 so that the probe front ends 32 will make respective contacts with the bumps 611 (in the drawings, two pairs are shown). After all the contacts have been formed, the overdrive for about 0.1 mm is acted thereon, by which act the errors caused by variations in the different heights of bumps. 611 and positions of the probe ends 32 are resolved with the aid of the deformation of the resin 50 as shown in FIG. 3, i.e. a slight upward deformation. Then, the desired even contact pressures are attained with all the contacts between the probe ends 32 and the bumps 611.

Figure 4:
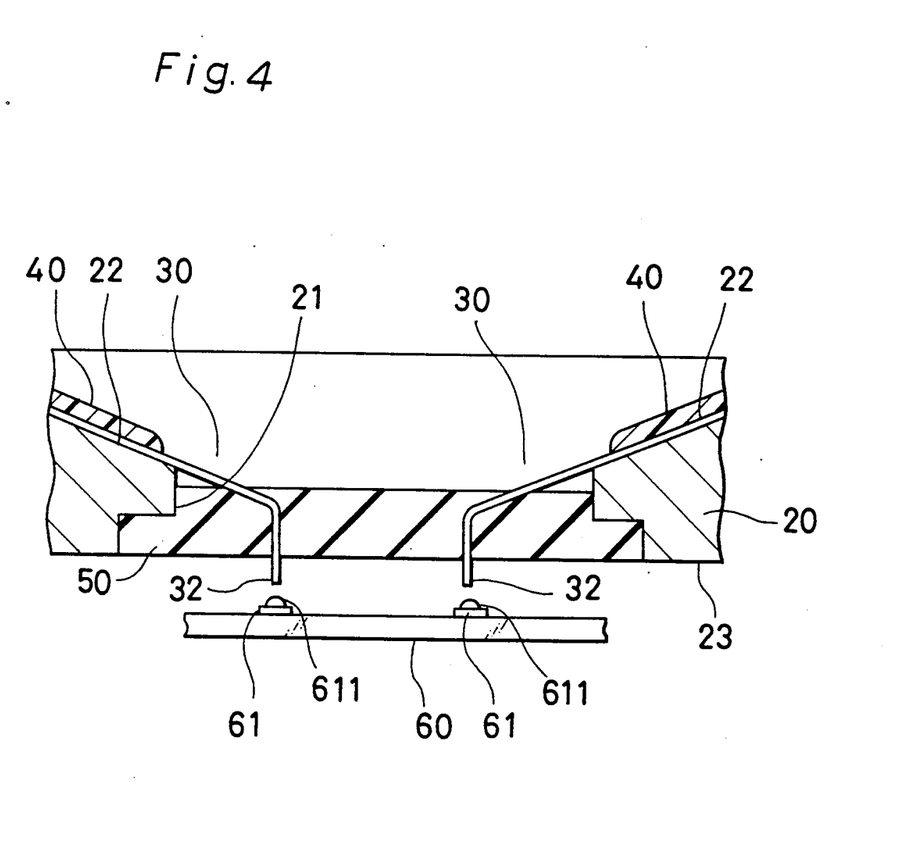
FIG. 4 shows a schematic sectional view of another embodiment having a modification from the embodiment shown by FIG. 1.

To supplement the description above, a plurality of the probes 30 are arranged as a whole in a radial formation in plan view. This arrangement will be generally understood by FIG. 9 which will be described later. However, such an arrangement may be modified case by case. For instance, the probes can be disposed in multiple layers, laying one probe upon an epoxy resin 40 applied to an underlying probe. As shown in FIG. 4, a layer of the resin 40 may be thickened to cover the L bending point. Such thickening will give firmer positionings of the probe ends 32. Further, if a small opening is left at a central portion of the resin layer 50, such an opening is made use of writing or inking on an IC chip thereunder, for instance, a refuse mark when the testing ends.

Figure 5:
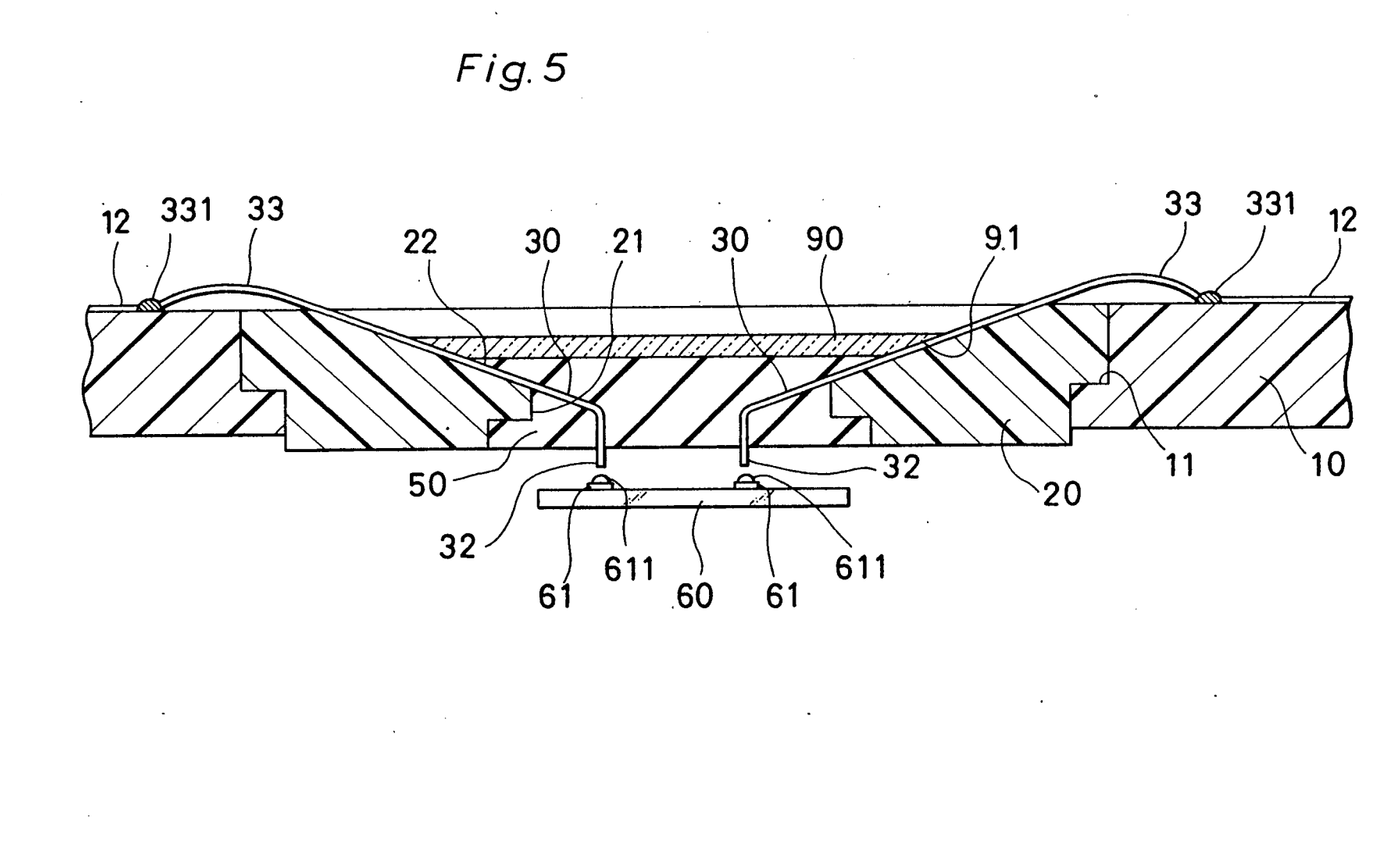
FIG. 5 shows a schematic sectional view of a second embodiment.

Referring to an embodiment as shown in FIG. 5, this embodiment features thickening the resin layer 50 upward to fill not only the opening or internal open area 21, but also some lower portion of the inward slope or the upper side 22 formed with the supporter 20 and in provision of a pressure plate 90 overlying on the thickened resin layer 50.

This increased layer 50 improves further relative positionings of respective probe ends 32, and also helps securance of the probes 30 to the supporter 20.

The pressure plate 90 is formed with glass or a hard plastic and is tightly attached to the resin layer 50. To that end, the plate 90 is rendered a tapered periphery to fit with the sloping upper side 22. In operation, the plate 90 will restrict deformation of the resin layer 50 caused by the overdrive. Therefore, in the case that very fine probes are applied, deformation can be controlled and consequently a desired contact pressure may be obtained.

Figure 6A:
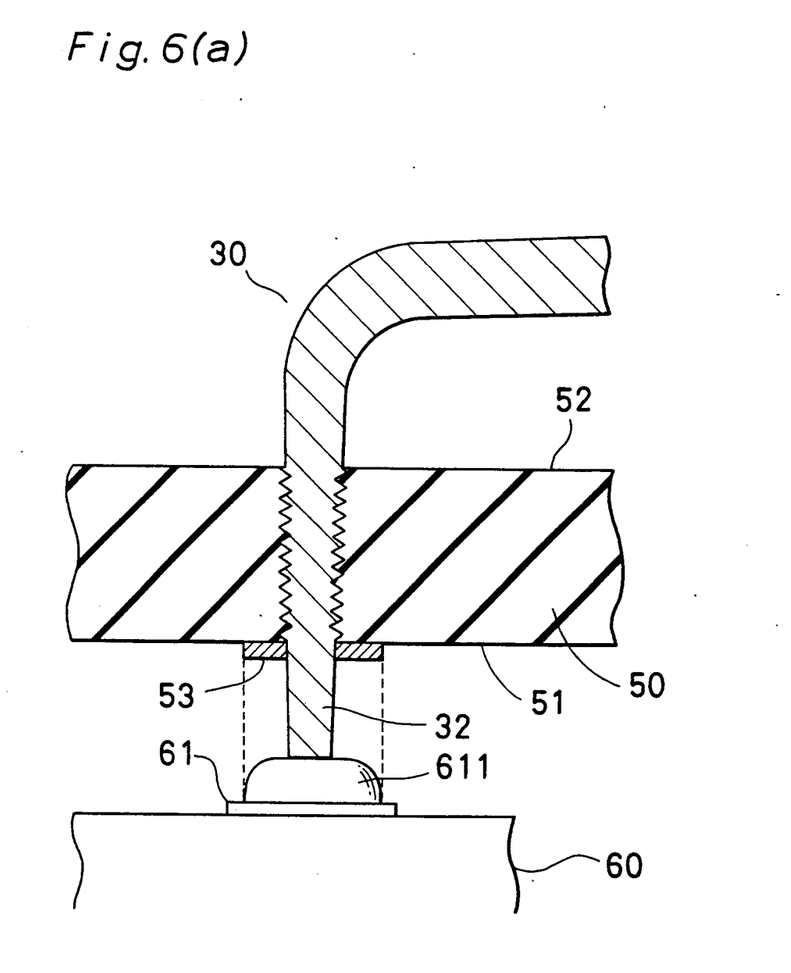

Referring to the third aspect of the present invention with use of FIG. 6, this embodied probe card includes much the same portions as described with reference to FIGS. 1–4 except that a mark 53 is placed on the resin layer 50 to be around the probe tube 30. Therefore, description on the like portions are abbreviated. In this case, the resin layer 50 through which a tip portion 32 of the probe 30 is set up to be transparent, and the mark 53 with an opaque color and having much the same contour size as a bump 611 is attached on the underside of the resin layer 50 as shown FIG. 6 (a). This agreement in size between a bump 611 and a mark 53 is utilized to determined a desired alignment of these two parts. In aligning work, when the bump 611 and the mark 53 in sight supersede each other, an accurate alignment is obtained. When all of the remarks 53 are brought into such a state, the best alignments are reached.

Figure 6B:
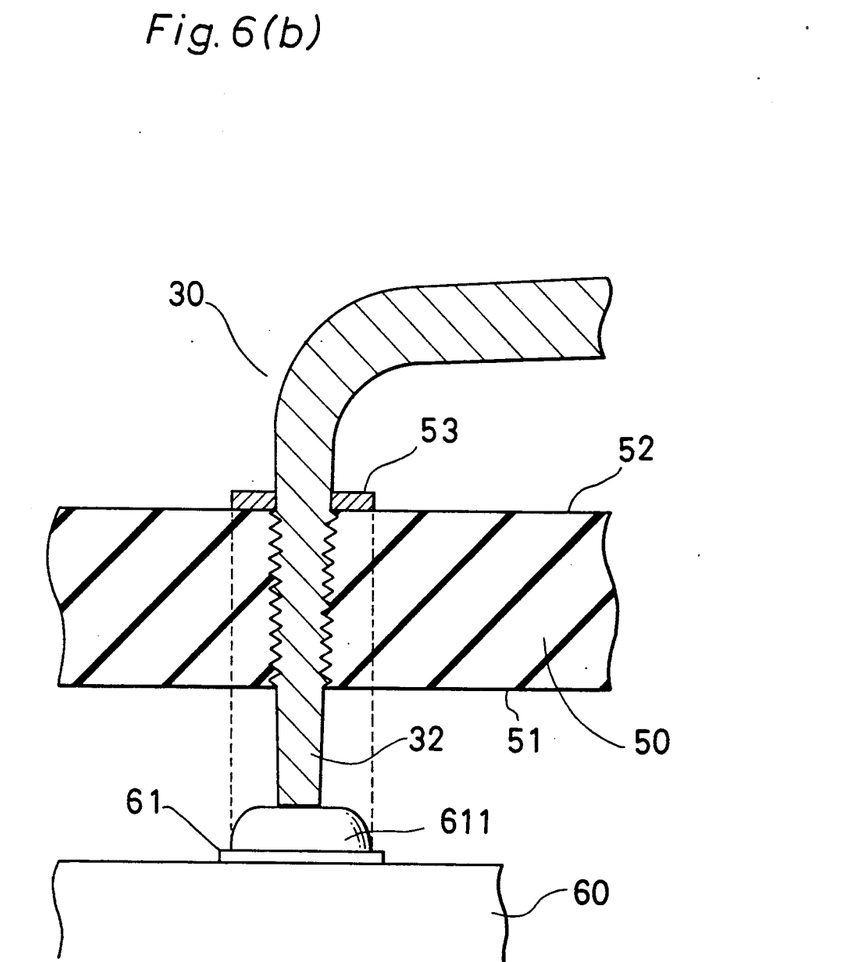
Figure 6C:
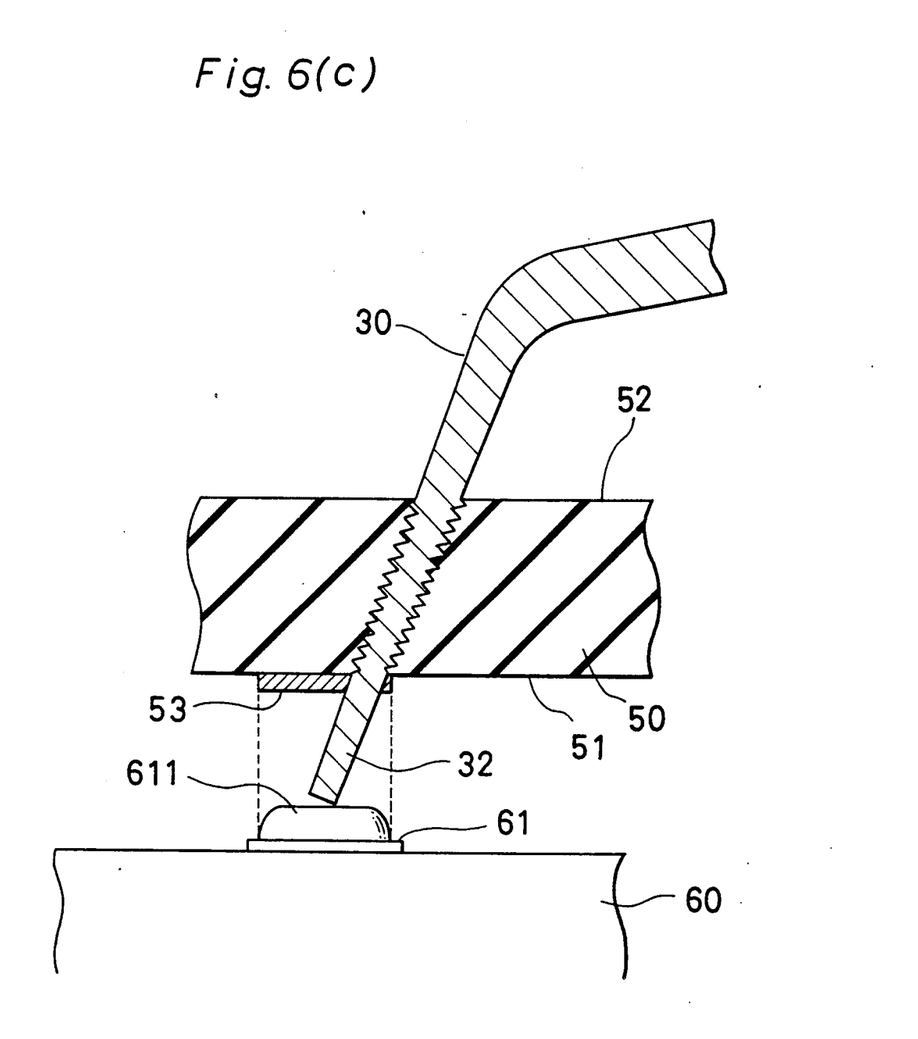

The mark 53 may be placed on the upper side 52 of the resin layer 50 as shown in FIG. 6 (b). In the case where the probe tip 32 is oblique, the mark 53 may be made eccentric to register with the bump 611 in vertical sight.

Therein, the insulative resin 50 is preferred to be transparent, but may be somewhat light transmissible to such an extent as to be able to determine the registration.

Figure 7:
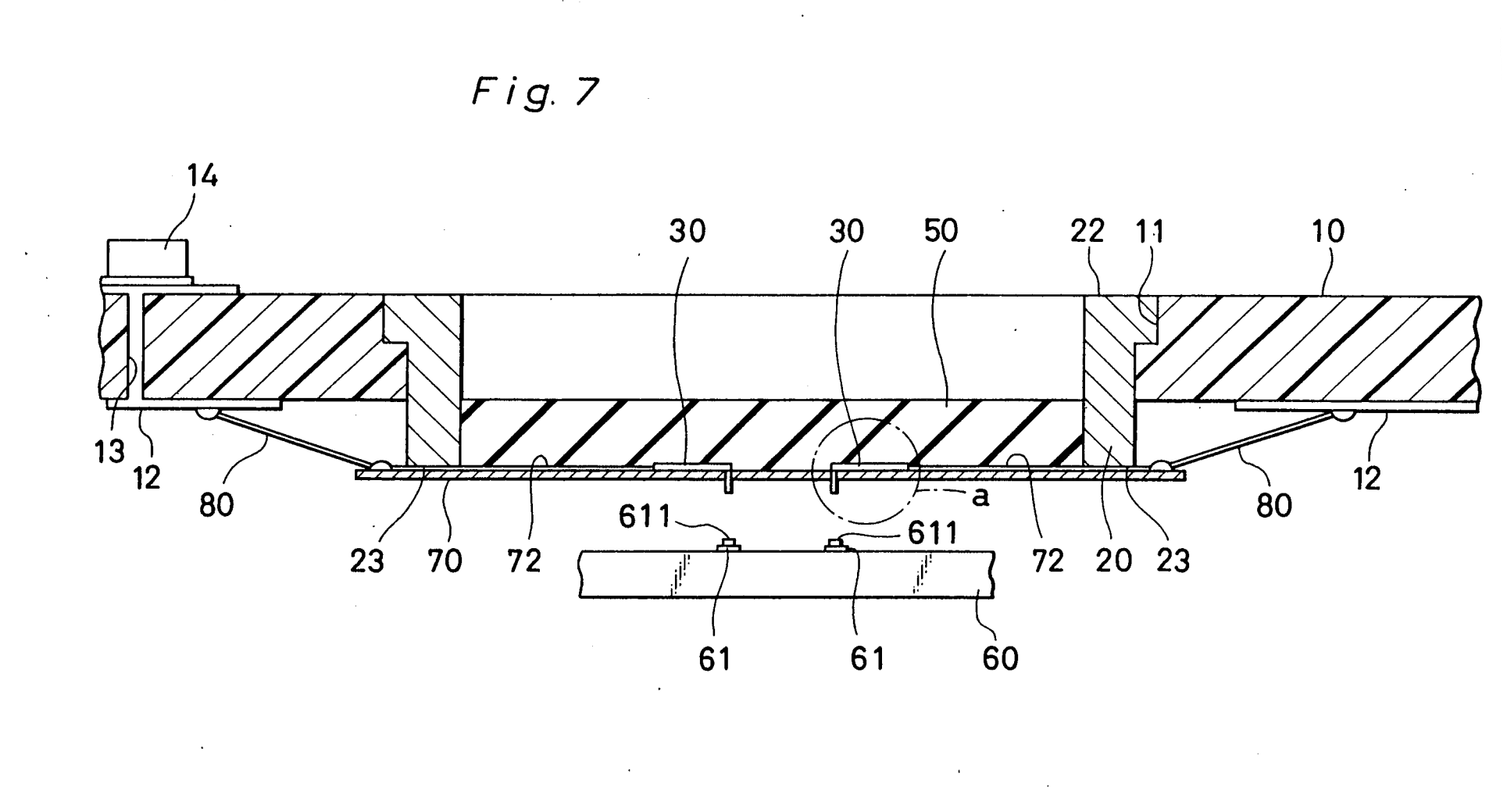
Figure 8:
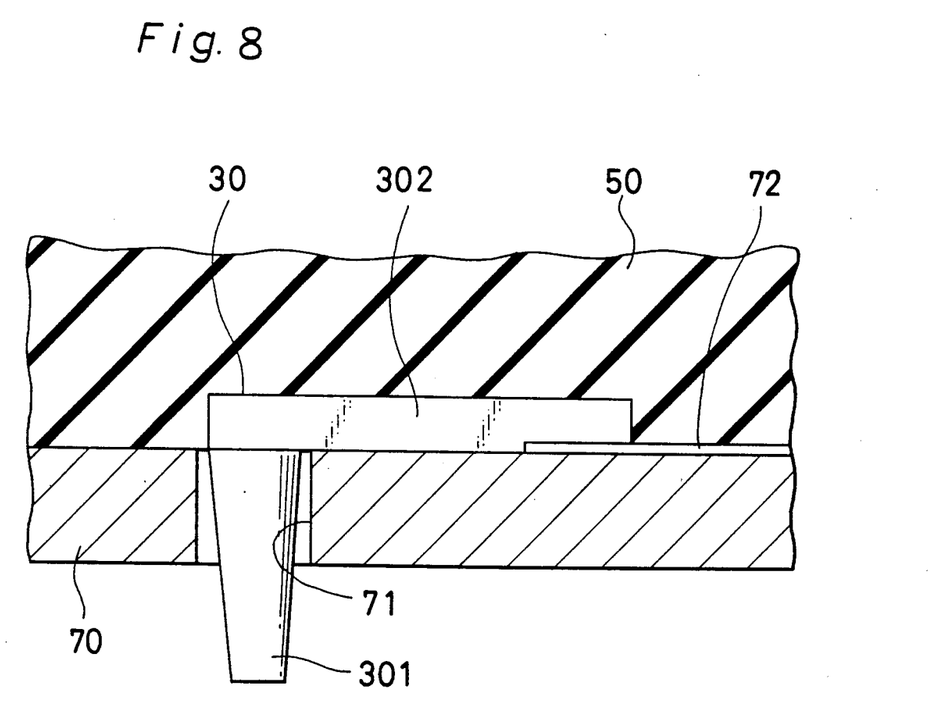
FIG. 8 shows a schematic sectional view of a fourth embodiment.
Figure 9:
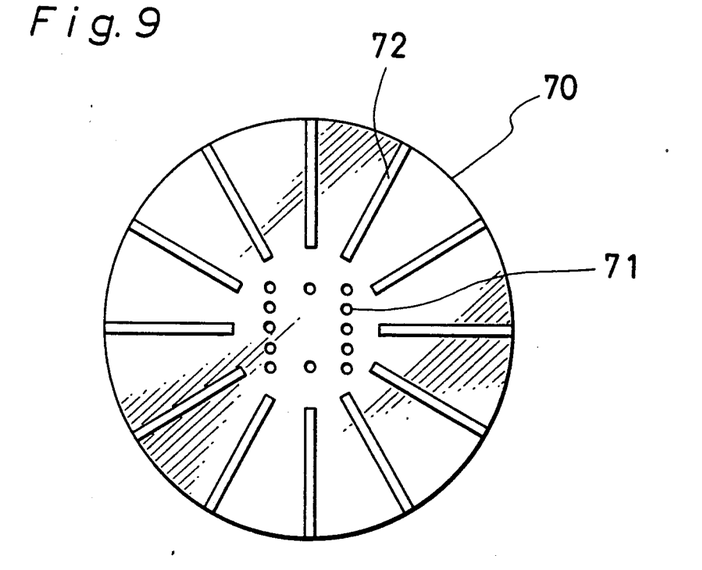
FIG. 9 shows a plan view of a flexible film which is involved in mountings as shown in FIG. 7.

Referring to the fourth aspect of the invention with mention to FIGS. 7–9, a substrate 10 is provided both on an upper side and an under side with printed circuits 12 made from copper films which are interconnected with a lead penetrating through a through hole 13. At a central portion of the substrate 10, an opening 11 with a step is formed. An electronic part is connected to the printed circuits 12.

An insulative supporter 20 is engaged internally with the opening 11, has a generally ring shape and is set to have its under side 23 projected downwardly from the underside of the substrate 10.

A flexible film 70 is a kind of insulative thin film and has a diameter slightly larger than that of the supporter 20. As illustrated in FIG. 8, the film 70 has been priorly provided at its a central portion with holes 71 (FIG. 8 shows one of them) so that a probe 30 is laid on the film 71 to have the front end 301 extended downwardly through each hole 70. As a whole on the film 70 as shown in FIG. 9, the holes 71 are centrally located and lead lines 72 are radially arranged. The film 70 is attached with the under side 23 downward to fill the opening or internal open area of the ring supporter 20, keeping the side mounting lines 72 upward. The holes 71 are disposed to be correspondent to electrical ends arranged on an IC chip 60 as shown in FIG. 7.

In this case, the probe 30 is integrally formed with the front portion 301 shaped like a needle to contact a bump 611, and a hold portion 302 bent transverse to the front portion 301 to form an L shape as a whole as shown in FIG. 8. The front portion 301 is made slender to have insertibility into a hole 71 and the hold portion 302 is connected to a lead line 72 when the front portion 301 is inserted through the hole 71. Such probes are manufactured by micro engineering including photoetching.

An insulative resin 50, which is filled into the cavity formed by the film 70, and the ring wall, of supporter 20, may be a moderately elastic resin may be selected from materials such as silicone rubbers, as and epoxy resins, for instance.

Filling such a resin into the cavity secures the probes 30 to the film 70. Each probe 30 with the hold portion 302 is connected to the lead 72. The resin 50 is preferably transparent so as to be helpful to the alignment, though, an opaque resin is also permitted.

A lead line 80 is intended to connect the circuits 72 of the flexible film 70 to the printed circuits 12 of the board 10. Therefore, a probe 30 is connected to probing equipment, not shown, via the line 72, lead 80, and circuits 12 in view of parts shown in the drawings.

In operation, the front ends 301 of the probes 30 are each contacted to each bump 611 of the end 61 on an IC chip 60, and the overdrive is acted, while difference in heights of the bumps 611 is absorbed by deformation of the resin 50. This function affords desired contact pressures between the probes 30 and the bumps 611.

What is claimed is:

1. A probe card for measuring electrical characteristics of an IC chip by contacting a probe to an electrical end on the IC chip, said probe card comprising:
   a board provided with printed circuits and an opening at a central portion;
   a supporter, in a generally ring shape, having a size which engages inside the opening of the board, said ring supporter having an internal open area;
   a plurality of probes having rear ends connected with the circuits and having front ends projected downwardly into said internal open area of the ring supporter; and
   an elastic deformable insulative resin layer filling the internal open area of the ring supporter and embedding a portion of the front ends of each probe therein to hold respective positions more accurately.

* * * * *